US007220462B2

(12) United States Patent
Ho

(10) Patent No.: US 7,220,462 B2
(45) Date of Patent: May 22, 2007

(54) METHOD AND ELECTRODE ASSEMBLY FOR NON-EQUILIBRIUM PLASMA TREATMENT

(75) Inventor: Yeu-Chuan Simon Ho, Naperville, IL (US)

(73) Assignee: Praxair Technology, Inc., Danbury, CT (US)

( * ) Notice: Subject to any disclaimer, the term of this patent is extended or adjusted under 35 U.S.C. 154(b) by 316 days.

(21) Appl. No.: 10/832,376

(22) Filed: Apr. 27, 2004

(65) Prior Publication Data

US 2005/0238817 A1 Oct. 27, 2005

(51) Int. Cl.
*H05H 1/24* (2006.01)
*C23C 16/54* (2006.01)
*H01J 7/24* (2006.01)
*H05B 31/40* (2006.01)

(52) U.S. Cl. .................. 427/569; 118/723 E; 118/722; 118/718; 315/111.21

(58) Field of Classification Search ..................... None
See application file for complete search history.

(56) References Cited

U.S. PATENT DOCUMENTS

| | | | | |
|---|---|---|---|---|
| 5,456,972 | A | 10/1995 | Roth et al. | 428/224 |
| 5,789,145 | A | 8/1998 | Glocker et al. | 430/527 |
| 6,118,218 | A | 9/2000 | Yializis et al. | 315/111.21 |
| 6,361,748 | B1 | 3/2002 | Prinz et al. | 422/186 |
| 6,388,381 | B2 | 5/2002 | Anders | 315/111.21 |
| 6,429,595 | B1 * | 8/2002 | Hammen et al. | 315/111.21 |
| 2005/0051084 | A1 * | 3/2005 | Lan et al. | 118/200 |

* cited by examiner

*Primary Examiner*—William Phillip Fletcher, III
*Assistant Examiner*—Cachet I. Sellman
(74) *Attorney, Agent, or Firm*—David M. Rosenblum

(57) ABSTRACT

A method and electrode assembly for treating a substrate with a non-equilibrium plasma in which the electrode assembly has two or more spaced barrier electrodes and a ground electrode spaced apart from the two spaced barrier electrodes for passage of a substrate to be treated. Plasma fluid medium is introduced between the barrier electrodes and is biased to provide a greater flow to an inlet region of the electrode assembly to help inhibit the ingress of air. Each of the barrier electrodes can be provided with central and leg sections having passages for introducing a cooling fluid into one of the leg sections and discharging said cooling fluid from the other of the leg sections. The central section can be provided with a transverse cross-sectional area less than that of the leg sections to increase velocity in the central section.

6 Claims, 2 Drawing Sheets

METHOD AND ELECTRODE ASSEMBLY FOR NON-EQUILIBRIUM PLASMA TREATMENT

FIELD OF THE INVENTION

The present invention provides a method of treating a substrate with a non-equilibrium plasma and an electrode assembly therefor in which a plasma medium is injected between barrier electrodes to prevent the ingress of air during treatment of the substrate

BACKGROUND OF THE INVENTION

Non-equilibrium plasma, produced by a uniform glow discharge, is utilized for the surface treatment of polymer films, fabrics, wool, metal, and paper to improve the physical and optical properties of the surface. Such properties include printability, wetability, durability, and adhesion of coatings.

The non-equilibrium plasma is generated within a thin gap between two electrodes. The gap is generally less than about two millimeters. A high voltage is applied to an active electrode. The active electrode is encased within a dielectric barrier that can be a ceramic or glass to ensure uniformity of the discharge. A grounded, counter electrode is positioned opposite to the active electrode and can be in the form of a rotating drum or a flat plate. A plasma medium which can be helium is injected into the region between the two electrodes to generate the non-equilibrium plasma. The substrate, which can be in sheet form, is passed between the active and counter electrodes to be treated by the non-equilibrium plasma. At high processing speeds, difficulties have arisen in treating the substrate due to a laminar flow barrier created by air entrainment. The entrained air flow mixes with the gas that is used as a plasma medium to alter the composition of the plasma, as well as its chemical kinetics and stability.

It is known to inject the plasma medium gas between electrodes and toward the substrate. For instance, in U.S. Pat. No. 6,361,748 B1 a barrier electrode arrangement is disclosed in which a process gas or plasma medium, that is also used for cooling purposes, is injected between two electrodes and towards the substrate surface to be treated. U.S. Pat. No. 6,429,595 discloses two air cooled electrodes in which the plasma medium gas is injected between the electrodes through a porous ceramic that acts as a diffuser. In both of these patents, at high processing speeds, air would tend to be drawn into the plasma medium to alter its composition.

As will be discussed, the present invention solves this problem by utilizing plasma medium in such a manner as to inhibit air ingress into the electrode assembly.

SUMMARY OF THE INVENTION

In one aspect, the present invention provides a method of treating a substrate with a non-equilibrium plasma. In accordance with the method, the substrate is passed within an electrode assembly for generating the non-equilibrium plasma such that the substrate moves from an inlet region of the electrode assembly to an outlet region of the electrode assembly. The motion of the substrate tends to entrain air into the electrode assembly from the inlet region thereof by virtue of motion of the substrate. The electrode assembly has at least two spaced barrier electrodes and a ground electrode spaced apart from the at least two spaced barrier electrodes for passage of the substrate therebetween. Each of the at least two barrier electrodes have an elongated configuration and a transverse orientation with respect to a direction of motion of the substrate.

The plasma medium is introduced between the at least two barrier electrodes toward the substrate so that the plasma medium flows toward the substrate and spreads out along the substrate towards the inlet region and the outlet region of the electrode assembly. The flow of the plasma medium is biased toward the inlet region of the electrode assembly, thereby to inhibit ingress of the air into the electrode assembly.

Each of the barrier electrodes can be formed of a dielectric material and can be provided with a central section containing a high voltage conductor and two leg sections angled away from the central section. The plasma medium is passed into a chamber located between and connected to the two barrier electrodes. A cooling fluid can be passed into cooling fluid passages located within said central and leg sections of said barrier electrodes by introducing said cooling fluid into one of said leg sections and discharging said cooling fluid from the other of the leg sections. The central section has a transverse cross-sectional area less than that of the leg sections so that the cooling fluid has a higher velocity in the central section than said leg sections. Since the high voltage conductor is in the central section and heat is generated from such conductor, the presence of higher flow velocity helps to increase the heat transfer in such central section of the electrode.

The cooling fluid is preferably made up of the plasma medium.

The ground electrode can be of flat, plate-like configuration. In such case, first and second sets of the at least two spaced barrier electrodes and chamber can be separated by the ground electrode. This allows two of the substrates to be passed into the electrode assembly between the first of the sets of the at least two spaced barrier electrodes and the ground electrode and between the second of the two sets of the at least two spaced barrier electrodes and plasma medium inlets and the ground electrode.

The present invention can also be effectuated in connection with a ground electrode in the form of a rotating cylinder rotating in the direction of motion of the substrate.

In embodiments of the present invention having a chamber, a plate-like baffle can extend from the chamber towards the ground electrode. The plasma medium can be biased by introducing a greater flow rate of the plasma medium along one side of the plate-like baffle than the other side thereof.

Another aspect of the present invention involves the provision of an electrode assembly for treatment of a substrate by a non-equilibrium plasma. In accordance with such aspect, at least two spaced barrier electrodes and a ground electrode are used. The ground electrode is spaced apart from the two at least two spaced barrier electrodes for passage of the substrate therebetween.

A chamber can be located between and connected to the at least two spaced barrier electrodes. The chamber has openings for introducing the plasma medium between the at least two barrier electrodes towards the substrate so that the plasma medium flows toward the substrate and spreads out along the substrate towards inlet and outlet regions of the electrode assembly. A plate-like baffle extends from the chamber towards the ground electrode. The openings to the chamber are located on opposite sides of said plate-like baffle to allow the flow of the plasma medium to be biased toward the inlet regions of the electrode assembly at which the substrate first enters the electrode assembly during treatment and thereby, to prevent ingress of air thereto.

Each of the at least two barrier electrodes can be formed of a dielectric material and has an elongated configuration and a transverse orientation with respect to a direction of motion of the substrate. A central section contains a high voltage conductor and two leg sections are angled away from the central section. The central and leg sections of said barrier electrodes have passages for introducing a cooling fluid into one of the leg sections and discharging the cooling fluid from the other of the leg sections. A high voltage conductor is located within the central section. The central section has a transverse cross-sectional area less than that of the leg sections so that the cooling fluid has a higher velocity in the central section than the leg sections. A chamber can be located between and connected to the at least two spaced barrier electrodes. The chamber is provided with openings for introducing the plasma medium between the at least two barrier electrodes towards the substrate so that the plasma medium flows toward the substrate and spreads out along the substrate towards inlet and outlet regions of the electrode assembly.

This aspect of the present invention allows an electrode to be constructed that in which the heat transfer capability of the heat transfer fluid is increase where needed, namely, the high voltage electrode.

The ground electrode can be of flat, plate-like configuration. In such case, the electrode assembly can further comprise first and second sets of the at least two spaced barrier electrodes and chamber separated by the ground electrode. This allows two of the substrates to pass into the electrode assembly between the first of the sets of the at least two spaced barrier electrodes and the ground electrode and between the second of the sets of the at least two spaced barrier electrodes and the ground electrode to simultaneously treat the two of the substrates.

Alternatively, the ground electrode can be a rotating cylinder rotating in the direction of motion of the substrate.

In any embodiment of the present invention, the high voltage conductor can be brazed to the central section.

BRIEF DESCRIPTION OF THE DRAWINGS

While the specification concludes with claims distinctly pointing at the subject matter that Applicants regard as their invention, it is believed that the invention will be better understood when taken in connection with the accompanying drawings in which:

DETAILED DESCRIPTION

Figure 1:
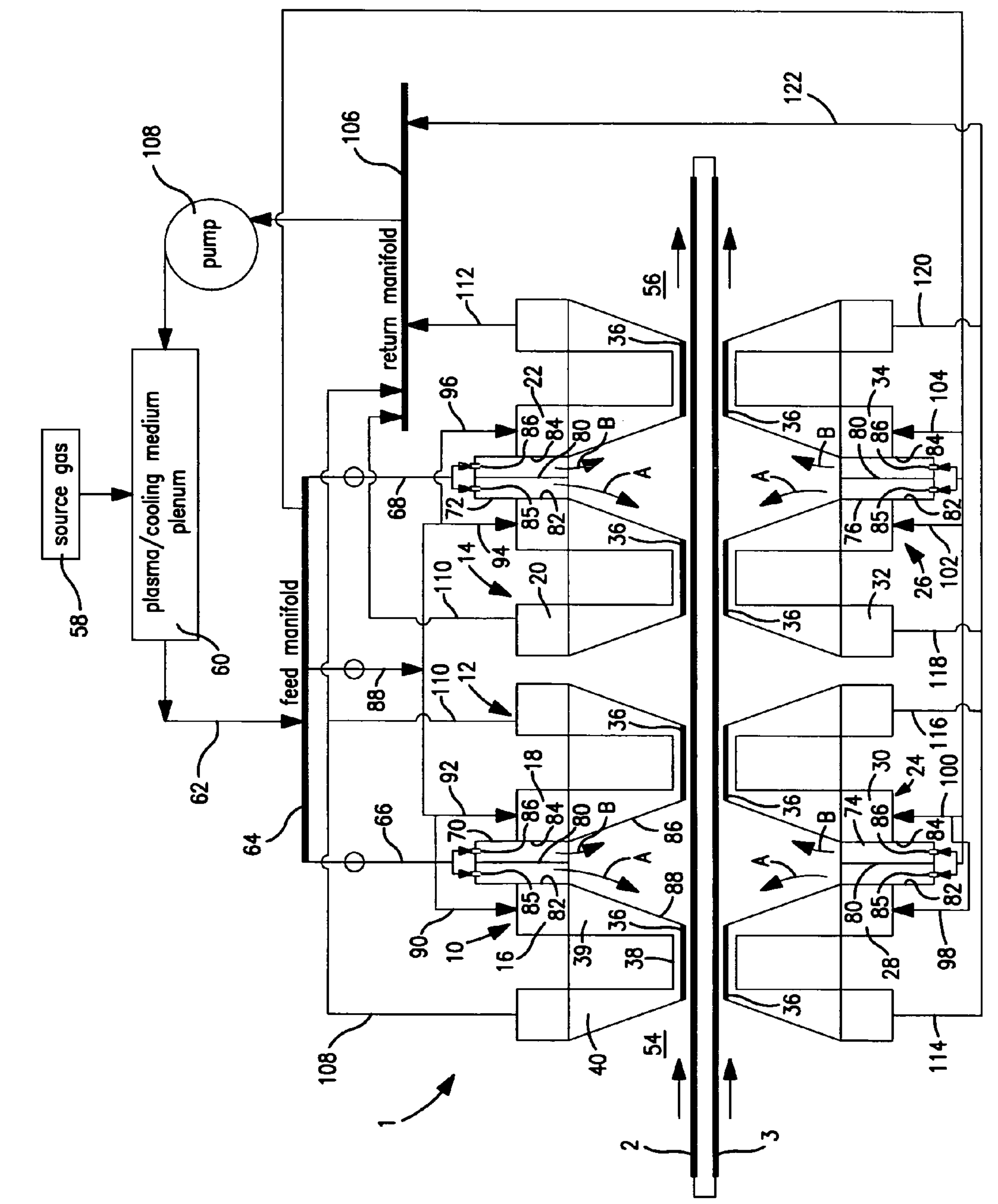
FIG. 1 is a schematic sectional view of an electrode assembly for carrying out a method in accordance with the present invention.

With reference to FIG. 1, an electrode assembly 1 is illustrated for treating substrates 2 and 3 by generation of a non-equilibrium plasma.

Electrode assembly 1 is provided with a first set of pairs of barrier electrodes 12 and 14. Pair 12 consists of two barrier electrodes 16 and 18 and pair 14 consists of two barrier electrodes 20 and 22. A second set of pairs of barrier electrodes 24 and 26 can be provided. Pair 24 consists of two barrier electrodes 28 and 30 and pair 26 consists of two barrier electrodes 32 and 34.

Each of the barrier electrodes 16, 18, 20, 22, 28, 30, 32 and 34 are of elongated configuration and are oriented transversely to the direction of travel of the substrates 2 and 3. Further each of the barrier electrodes 16, 18, 20, 22, 28, 30, 32, and 34 are formed of a dielectric material, for instance glass or a ceramic that enclose a high voltage conductor 36.

With reference to barrier electrode 16 (although the discussion has equal applicability to each of the other barrier electrodes 18, 20, 22, 28, 30, 32 and 34), a high voltage conductor is located within a central section 38. Two leg sections 39 and 40 that are angled away from central section 38. Central section 38 and leg sections 39 and 40 are hollow to provide flow passages located therein. A coolant, that can be the plasma medium, is introduced into one leg section 39 and is discharged from the other leg section 40 after having passed through central section 38. Central section 38 has a lower transverse cross-sectional flow area than those of leg sections 39 and 40 so that the velocity of the flow is greater in central section 38 than leg section 39 and therefore, the heat transfer rate. This is advantageous in that a strategic cooling can be achieved using the generated high speed cooling jet towards the high voltage conductor 36 where the heat is generated.

The high voltage conductor 36 is strip-like and is connected to central section 38 by such means as adhesives and brazing. In this regard to obtain excellent hermetic properties and reduce problems related to voids and thermal expansion, the high voltage conductor 24 and dielectric barrier surfaces are assembled with the necessary brazing assembly materials. The brazing solder materials can be pre-applied to the individual piece in the quantities required for selected metal and dielectric materials. Typical materials used for an electrode assembly in accordance with the present invention and brazing solder combinations are listed in the table below.

TABLE

| High voltage conductor 24 | Brazing-solder | Dielectric Material |
|---|---|---|
| Cu | AgCu 28% | SiO2 |
| Fe/Ni | AgCu 15% | Si3N4 |
| Kov | AgGe 13% | Al2O3 |
| Fe/N142 | AgSn 20% | TiO2, Ta2O5 |

For compatibility with highly diversified substrates during thermal expansion for thin electrodes, the high voltage conductors can be deposited directly on the dielectric surface using metal pastes such as Cu paste, Ag/Cu paste, and Ag/Pt paste etc. Selected powders used in the pastes can produce remarkably thick and dense film on the dielectric surfaces.

A counter or ground electrode 52 is provided between the sets of barrier electrodes 16, 18, 20, 22, 28, 30, 32 and 34 with clearance for substrates 2 and 3. The aforesaid arrangement of barrier electrodes 16-34 provide an inlet region 54 and an outlet region 56 for the electrode assembly 1. Substrates 2 and 3 enter electrode assembly 1 through inlet region 54 and after treatment pass out of electrode assembly 1 from outlet region 56. The motion of substrates 2 and 3 tends to entrain air into the electrode assembly.

A plasma medium, for instance, helium, is obtained from a source 58, which may be a tank of helium. The plasma medium is introduced into a plasma/cooling medium plenum 60. Plasma/cooling medium plenum 60 is a pipe having cooling fins and a draft fan to circulate draft air past the cooling fins for cooling purposes.

Plasma/cooling medium plenum 60 is connected by way of a conduit 62 to a feed manifold 64. Feed manifold 64 is in turn connected by conduits 66 and 68 to chambers 70 and 72 of barrier electrode pairs 16, 18 and 20, 22, respectively. Additionally, feed manifold 64 is similarly connected to chambers 74 and 76 associated with barrier electrode pairs 28, 30 and 32, 34, respectively, by a conduit 78.

Plasma medium passes through openings provided for in chambers 70, 72, 74 and 76 and is directed towards substrates 2 and 3, respectively. As such each of the chambers 70, 72, 74 and 76 is open to allow the plasma medium to escape toward substrates 2 and 3 and is elongated to distribute the plasma medium along the lengths of the electrode pairs. As will be discussed, the plasma medium enters chambers 70, 72, 74 and 76 through openings that will be discussed hereinafter. When the plasma medium reaches substrates 2 and 3, it spreads out toward the inlet and outlet regions 54 and 56 of the electrode assembly 1.

A glow discharge generated by a high voltage applied to high voltage conductors 36 and ground electrode 52 produces a non-equilibrium plasma to treat the surfaces of substrates 2 and 3.

Each of the chambers 70, 72, 74 and 76 is divided by an elongated, plate-like baffle 80 produce two open chambers 82, 84 for each of pairs of barrier electrodes, 12, 14 and 24, 26. Openings 85 and 86 are provided in chamber 70 on either side of plate-like baffle 80 with openings 85 being closer to inlet 84. In this regard, openings 85 or openings 86 would be an array of openings along the length of chamber 70 or any other chamber illustrated herein. The flow to chamber 82 is greater than the flow to chamber 84 to bias the flow. This can be accomplished by providing openings 85 with a high cross-sectional area than openings 86 or by providing the plasma medium to openings 85 at a higher pressure than openings 86. This creates a greater flow in chambers 82 than in chambers 84. Since chambers 82 are closer to inlet region 54, the flow of plasma fluid is greater in directions of arrow A as opposed to arrowheads B. Alternatively, the baffles 80 could be positioned closer to outlet region 56 to provide a similar effect. A still further possibility would be to shape electrode pairs, for instance, the side 86 of electrode 18 to be closer to vertical than the side 88 of electrode 16, thereby urging the flow of plasma medium toward region 54. Still another means to bias the flow would be to provide a greater flow to electrode pairs to 16, 18 and 28, 30 as opposed to electrode pairs 20, 22 and 32, 34.

As mentioned above, each of the barrier electrodes 16, 18, 20, 22, 28, 30, 32 and 34 is hollow to allow for the passage of a cooling fluid. The cooling fluid can be the same as the plasma medium, for instance, helium. As illustrated, conduit 88 is connected to feed manifold 64 and is provided with branches 90, 92, 94 and 96 in case of barrier electrode pairs 16, 18 and 20, 22 and branches 88, 100, 102 and 104 from conduit 78 previously discussed with respect to feeding plasma fluid medium to plasma fluid medium inlets 74 and 76. After having been heated, the barrier fluid is returned to a return manifold 106 by way of return conduits 108, branch 110 joining conduit 108 and return conduits 110 and 112. Return conduit branches 114, 116, 118 and 120 feed into return conduit 122 to return the heated cooling fluid to return manifold 106. A pump 108 is connected to return manifold 106 to pump the heated cooling fluid to pump the heated cooling fluid back to plasma/cooling medium plenum 60 which as stated previously is provided with cooling fins and a draft fan to cool the heated fluid plasma medium.

As may be appreciated, an embodiment of present invention could be provided with only a single pair of barrier electrodes, for example, barrier electrodes 16 and 18. Similarly, a single set of barrier of electrodes could be provided, for instance, barrier electrodes 16, 18, 20 and 22. In such case, barrier electrodes 28, 30, 32 and 34 would be omitted. Such device would only be capable of treating a single substrate at any one time, for instance, substrate 2.

Figure 2:
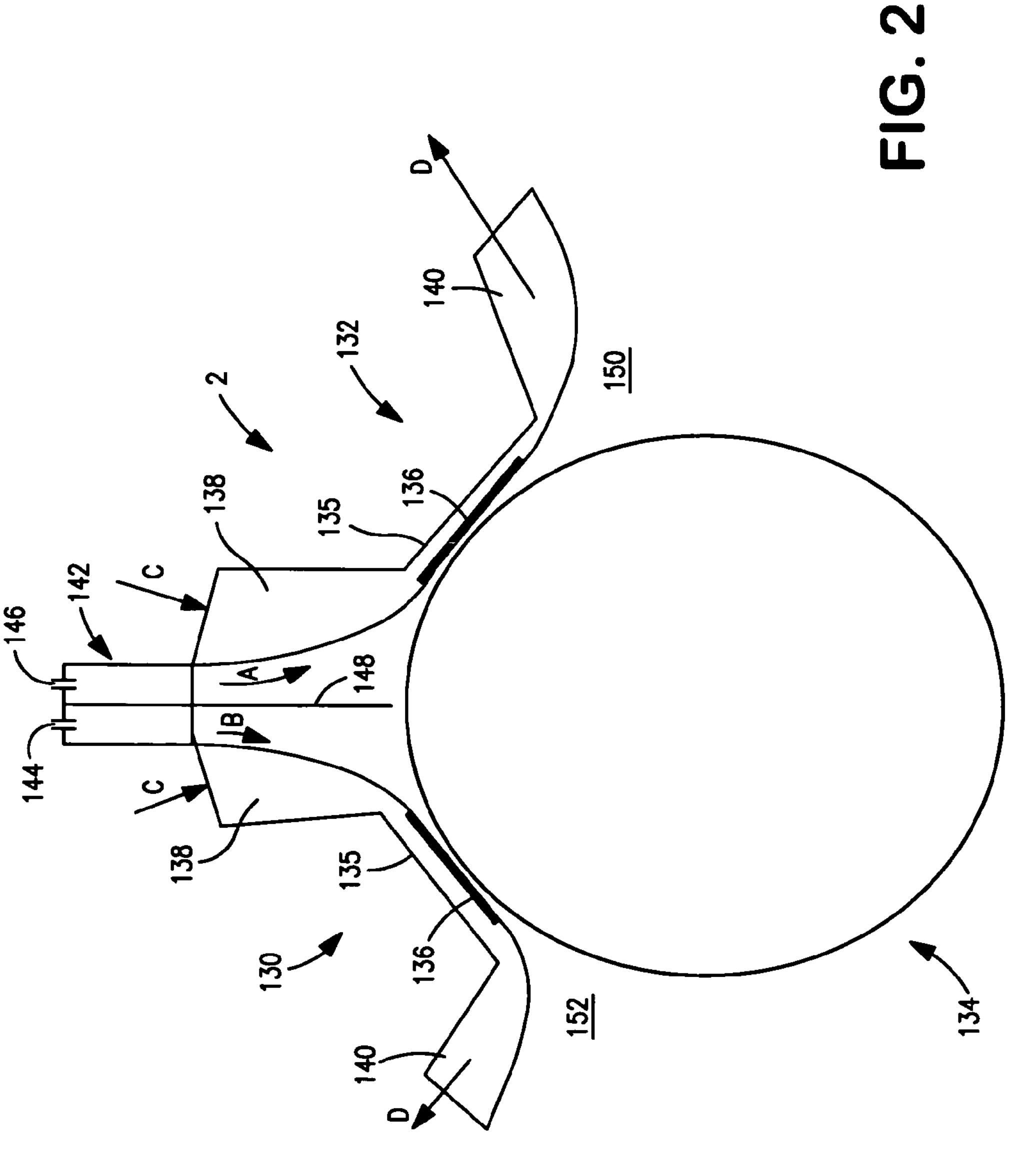
FIG. 2 is a sectional, schematic view of an alternative embodiment of an electrode assembly for carrying out a method in accordance with the present invention.

With reference to FIG. 2 an alternative electrode assembly 2 of the present invention is illustrated. In this embodiment, two barrier electrodes 130 and 132 are provided and a rotating cylindrical ground electrode 134 is situated beneath barrier electrodes 130 and 132. Each of the barrier electrodes 130 and 132 has a body formed of a dielectric and is provided with elongated, high voltage conductors 136 connected in place in the manner described above with respect to high voltage conductors 36.

Each of the barrier electrodes 130 and 132 are of similar design to the barrier electrodes discussed in reference to FIG. 1 in that each has a central section 135 containing the high voltage conductor 136 and two leg sections 138 and 140 angled away from central section 134. Each barrier electrode 130 and 132 is of elongated configuration and is oriented transversely to the direction of travel of the substrate. High voltage conductor is in the form of a conductive strip.

Leg sections 138 of barrier electrodes 130 and 132 are connected by a chamber 142 which would be of elongated configuration and open at the bottom (as viewed in the illustration). Chamber 142 has arrays of openings 144 and 146, extending along the length of chamber 142, that are separated by an elongated plate-like baffle 148.

A substrate to be treated enters an inlet region 150 and is discharged from an outlet region 152 defined between leg sections 140 and ground electrode 134 which would rotate in a counter clockwise direction. The motion of the substrate to be treated and the rotation of ground electrode 134 tends to cause air to enter inlet region 150 and mix with the plasma medium. In order to combat this, In the same manner as discussed with respect to chambers 70, 72 and etc., the flow may be biased towards inlet region 150 by increasing the flow, shown again by arrowhead "A" through openings 146.

As indicated above, each of the barrier electrodes 130 and 132 is hollow to provide cooling fluid passages. The cooling fluid is introduced into leg section 138 in the direction of arrowhead "C" and discharged from leg section 140 in the direction of arrowhead "D". Central section 135 has a smaller, transverse cross-sectional flow are to increase the velocity of the cooling fluid and hence, also increase the heat transfer in the area of high voltage conductor 136 where heat is generated. It is to be noted that a similar arrangement of distribution manifolds and conduits to that shown in connection with FIG. 1 could be used to circulate cooling fluid and plasma medium which could have the same make-up, for instance, helium.

While the present invention has been described with reference to a preferred embodiment, as will occur to those skilled in the art, numerous changes, additions and omissions may be made without departing from the spirit and scope of the present invention.

I claim:

1. A method of treating a substrate with a non-equilibrium plasma comprising:

passing the substrate within an electrode assembly for generating the non-equilibrium plasma such that the substrate moves from an inlet region of the electrode assembly to an outlet region of the electrode assembly and thereby tends to entrain air into the electrode assembly from the inlet region thereof by virtue of motion of the substrate;

the electrode assembly having at least two spaced barrier electrodes and a ground electrode spaced apart from the two spaced barrier electrodes for passage of the substrate therebetween, each of the at least two barrier electrodes having an elongated configuration, a transverse orientation with respect to a direction of motion of the substrate, a central section containing a high voltage conductor and two leg sections angled away from the central section and being formed of a dielectric material;

introducing plasma medium into a chamber located between and connected to the at least two barrier electrodes toward the substrate so that the plasma medium flows toward the substrate and spreads out along the substrate towards the inlet region and the outlet region of the electrode assembly; and biasing flow of the plasma medium toward the inlet region of the electrode assembly to inhibit Ingress of the air into the electrode assembly;

passing a cooling fluid into cooling fluid passages located within said central and leg sections of said barrier electrodes by introducing said cooling fluid into one of said leg sections and discharging said cooling fluid from the other of the leg sections; and the central section having a transverse cross-sectional area less than that of the leg sections so that the cooling fluid has a higher velocity in the central section than said leg sections.

2. The method of claim 1, wherein the cooling fluid is made up of the plasma medium.

3. The method of claim 1, wherein the ground electrode is of flat, plate-like configuration.

4. The method of claim 3, further comprising:

first and second sets of the at least two spaced barrier electrodes and chamber separated by the ground electrode; and passing two of the substrates into the electrode assembly between the first of the sets of the at least two spaced barrier electrodes and the ground electrode and between the second of the two sets of the at least two spaced barrier electrodes and the ground electrode to simultaneously treat the two of the substrates.

5. The electrode assembly of claim 1, wherein said ground electrode is a rotating cylinder rotating in the direction of motion of the substrate.

6. The method of claim 3 or claim 5, wherein:

a plate-like baffle extends from the chamber towards the ground electrode; and the plasma medium is biased by introducing a greater flow rate of the plasma medium along one side of said plate-like baffle than the other side thereof.

* * * * *